United States Patent [19]
Stevens

[11] Patent Number: 5,465,065
[45] Date of Patent: Nov. 7, 1995

[54] GATE COMPENSATION DELAY AND DELAY LINES

[75] Inventor: Rick Stevens, Apple Valley, Minn.

[73] Assignee: Unisys Corporation, Blue Bell, Pa.

[21] Appl. No.: 40,480

[22] Filed: Mar. 31, 1993

[51] Int. Cl.$^6$ .................................................. H03H 11/26
[52] U.S. Cl. ........................ 327/276; 327/278; 327/263
[58] Field of Search .................................. 307/601, 602,
307/603, 358, 592, 595, 269; 328/55, 56;
327/276, 277, 278, 263, 269, 270

[56] References Cited

U.S. PATENT DOCUMENTS

| 5,245,231 | 9/1993 | Kocis | 307/606 |
| 5,349,612 | 9/1994 | Guo | 375/118 |

*Primary Examiner*—William L. Sikes
*Assistant Examiner*—Tiep H. Nguyen
*Attorney, Agent, or Firm*—Nawrocki, Rooney & Sivertson

[57] ABSTRACT

An apparatus for and method of producing a highly accurate and easily recalibratable delay line using only digital components. A serial string of digital gates or buffers is coupled together to permit an input signal to cascade through all of the gates or buffers. The length of time for the signal to cascade is determined by the average propagation delay of the buffers and the number of buffers in the serial string. Taps at the outputs of the buffers permit selection of the desired delay by selecting the output from less than all of the buffers in the string. Calibration is accomplished by passing a calibration pulse of predetermined pulse width through the delay string of buffers. A calibration register records the buffer position of the leading edge of the calibration pulse at the time the trailing edge of the calibration pulse enters the string. The number of buffers thus identified provides a delay equal to the length of the calibration pulse under the current ambient conditions. The delay line is periodically recalibrated to compensate for changes in ambient conditions.

6 Claims, 7 Drawing Sheets

GATE COMPENSATION DELAY AND DELAY LINES

BACKGROUND OF THE INVENTION

1. Field of the Invention

The present invention generally relates to digital electronic circuitry and more particularly relates to digital electronic circuitry for generating precise time delays.

2. Description of the Prior Art

It is well known that electronic circuits exhibit propagation time delays and such delays may be useful for various applications. U.S. Pat. No. 4,684,897, issued to Richards et al., shows the use of an electronic delay circuit, often called a "delay line", to produce predetermined frequency shifts in a signal. Distance is measured using delay circuits in U.S. Pat. No. 4,055,830, issued to Wilson et al. Other applications for electronic delay lines include: analog-to-digital conversion in U.S. Pat. No. 3,701,148, issued to Frei; measurement of signal slope in U.S. Pat. No. 4,815,113, issued to Ludwig et al.; calibration of oscilloscopes in U.S. Pat. No. 3,656,053, issued to Richman; reformation of a distorted pulse train using a comparison of two delay line outputs in U.S. Pat. No. 5,054,038, issued to Hedberg; and fluid flow measurement in U.S. Pat. No. 4,120,032, issued to Mirdadian.

Whereas most earlier prior art devices utilized analog delay circuitry, the current trend is to employ digital circuits whenever feasible as a means of controlling costs of manufacture and use. At times this involves digital control of delay circuits as shown in U.S. Pat. No. 3,681,706, issued to Harzer.

Even though circuit delays are important to many applications, it is also known that digital circuit propagation delays tend to vary with temperature, input signal, and supply voltage. To minimize and/or control this variability, a number of techniques are employed. U.S. Pat. No. 4,383,216, issued to Dorier et al., is concerned with chip-to-chip variation and attempts to control this with an on-chip delay voltage regulator. Iwahashi et al., in U.S. Pat. No. 4,473,762, attempt temperature compensation in MOS circuits with voltage control. CMOS output buffer switching time control is implemented in U.S. Pat. No. 4,818,901, issued to Young et al., by changing from constant current to constant voltage mode during the switching operation. A voltage controlled oscillator is employed by Bell et al. in U.S. Pat. No. 4,494,021, to minimize variation in delay line timing.

A highly effective solution to delay line timing control is found in U.S. Pat. No. 4,623,805, issued to Flora et al. This technique uses feedback supplied by phase comparison of the multi-tap delay line output to a fixed delay to provide for selection of the appropriate delay line tap. The bias voltage is varied in U.S. Pat. No. 4,641,048, issued to Pollock, to provide a measure of control over ECL circuit propagation delays.

U.S. Pat. No. 4,939,389, issued to Cox et al., uses a string of gates on a monolithic device to measure the propagation delay of the functionally active circuits on that device. In that way, it is assumed that compensation may be made for variations in propagation delays. U.S. Pat. No. 4,591,124, issued to Ledzius et al., provides a clock circuit directly on the monolithic device in an attempt to clock the device at or near the maximum rate under ambient conditions.

An active delay line using digital circuitry is found in U.S. Pat. No. 4,889,071, issued to Morales. In this approach, a reference clock output is compared to the outputs of the various delay elements. Phase differences result in changes in the control voltage supplied to the corresponding delay elements. In this manner, it is deemed that the individual delay elements can be held to have a constant propagation delay.

Though there are many applications known in the prior art for both analog and digital delay lines, most designs encounter change in delay time as a function of temperature, supply voltage, and other ambient variations. The standard technique for dealing with these variations in digital circuity is to measure phase change using some external standard and providing compensation by changes in voltage or mode in an attempt to maintain constant individual delay element propagation delays. This technique tends to be quite costly in view of the added hardware and need to maintain an accurate external timing standard.

SUMMARY OF THE INVENTION

The present invention overcomes the disadvantages found in the prior art by providing a delay line comprising digital circuity using only standard component types. Though the individual delay elements are expected to vary in propagation time as a function of temperature, voltage, etc., the total delay results from cascading the signal through a number of identical digital circuits on the same monolithic substrate. To compensate for timing variations, the delay line is periodically recalibrated in an efficient and highly accurate manner. These variations are then accommodated by using a differing number of individual circuits over varying timing delay conditions to provide the desired overall delay.

The preferred mode of the present invention is particularly adapted to decoding of serial data transmissions on a high speed, winchester-type, data bus. With multiple users of the bus providing data transmissions, the calibration signal is supplied by the transmitting user, which compensates for user timing base variations, as well.

The delay line is a serial string of monolithic buffer circuits (or gates) coupled together for cascading the input signal from input to output. The delay line provides a tap, or connection, between the output of each buffer and the input of the next sequential buffer. Therefore, the total delay can be selected by the average delay time per buffer multiplied by the number of buffers between the input and the selected tap. The periodic calibration signal identifies the number of buffers needed for the desired delay given the ambient conditions. As conditions change, recalibration causes a different number of buffers to be used for the same delay.

The calibration process involves transmission of a calibration pulse, reception of that calibration pulse, and recording of the number of buffers necessary to provide a delay equivalent to the length of the calibration pulse. Thus the calibration achieved is relative to the transmission of the calibration pulse rather than to some absolute standard. In this way errors in calibration pulse generation by the transmitting device are accommodated in the same fashion as corrections are made for propagation delay changes.

The taps from the delay line are latched in a calibration register. All buffers from the leading edge to the trailing edge of the calibration pulse record as ones during calibration. Similarly, all buffers not yet receiving the leading edge of the calibration pulse are recorded as zeroes. The output of the calibration register is used to control a multiplexer to select the appropriate tap for live signal processing in a given calibration state. Upon recalibration, a new value may be present in the calibration register, which selects a different multiplexer input for the same desired delay.

Thus the preferred mode of the present invention provides a fully digital delay line for the reception of high speed serial bus data, which is easily calibrated and recalibrated during normal operation. Because of the periodic recalibration, there is no need for high precision componentry.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
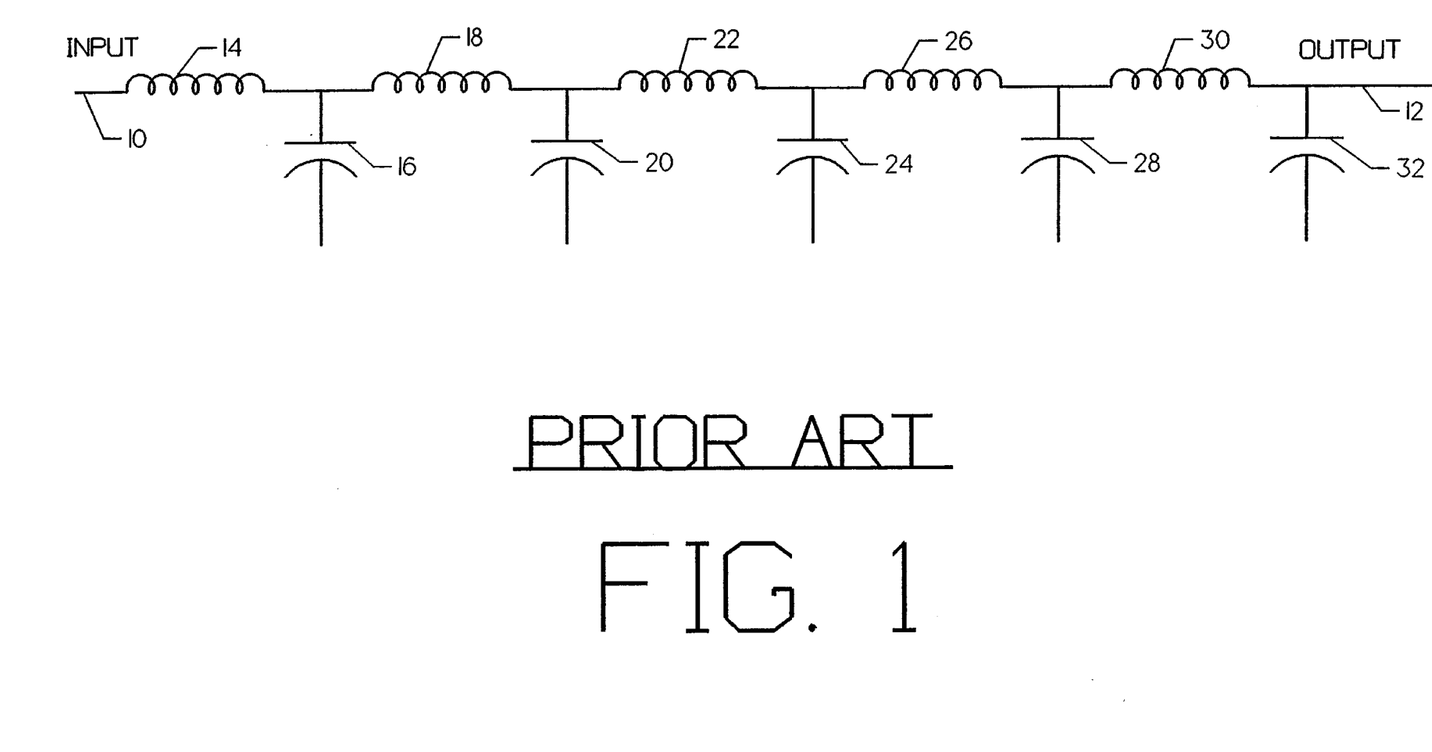
FIG. 1 is an electrical schematic diagram of a prior art delay line employing analog components.

FIG. 1 is an electrical schematic diagram of a conventional delay line as found in the prior art, having an input at point 10 and an output at point 12 with regard to a return conduction path. The delay line consists of coils 14, 18, 22, 26, and 30, along with capacitors 16, 20, 24, 28, and 32. Though there is much experience with such a prior art analog delay line, there are significant problems to be encountered.

The components tend to be large and expensive to build and interconnect. The resistance and inductive reactance of the coils must be tightly controlled. Similarly, the capacitance and leakage of the capacitors must be precisely known to provide an accurate delay line. Furthermore, the prior art delay line is subject to propagation delay variations based upon temperature and signal parameters for which there is no convenient compensation. A further problem with the design shown is the distributive capacitance associated with the connections when the components are actually assembled on a printed circuit board.

Figure 2:
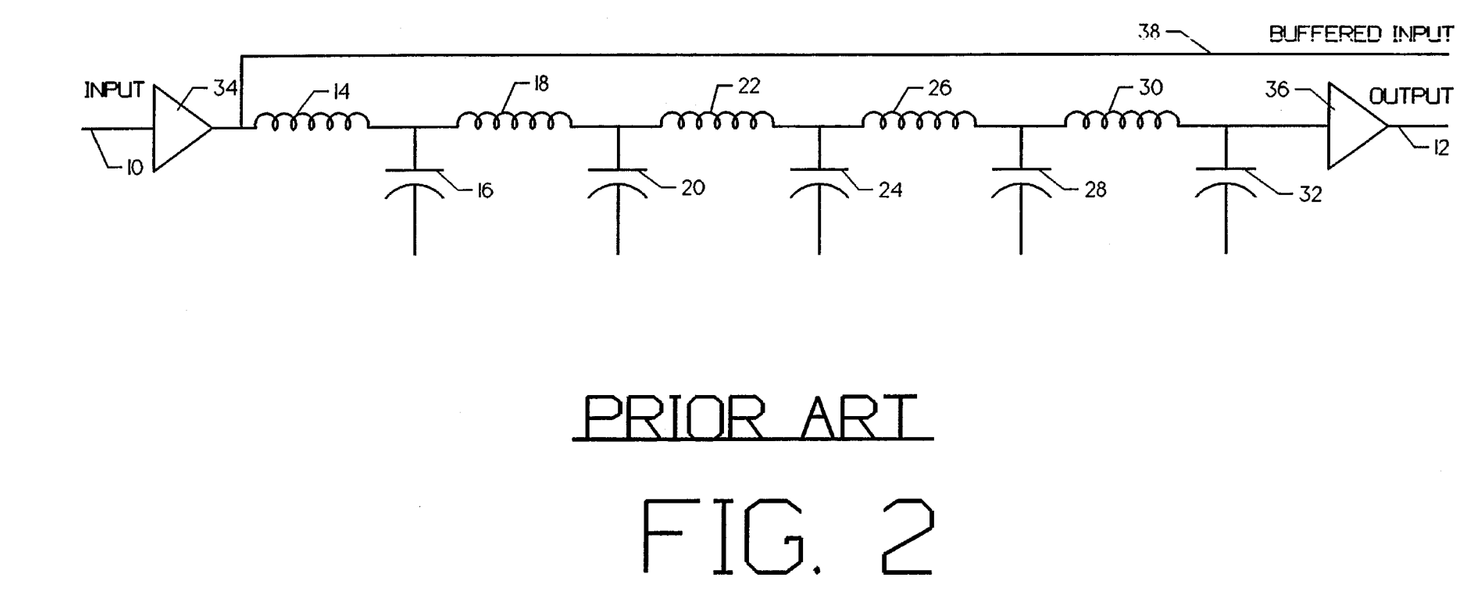
FIG. 2 is an electrical schematic diagram of a prior art delay line with buffering.

FIG. 2 is a schematic diagram of a prior art delay line which adds active elements. In addition to the components utilized in the circuit of FIG. 1, buffers 34 and 36 are provided to generally lower the system impedance and thus eliminate much of the variations supplied by the distributive capacitance. Thus buffered input 38 and output 12 are available at the same load impedance. All other referenced components are as previously described.

Figure 3:
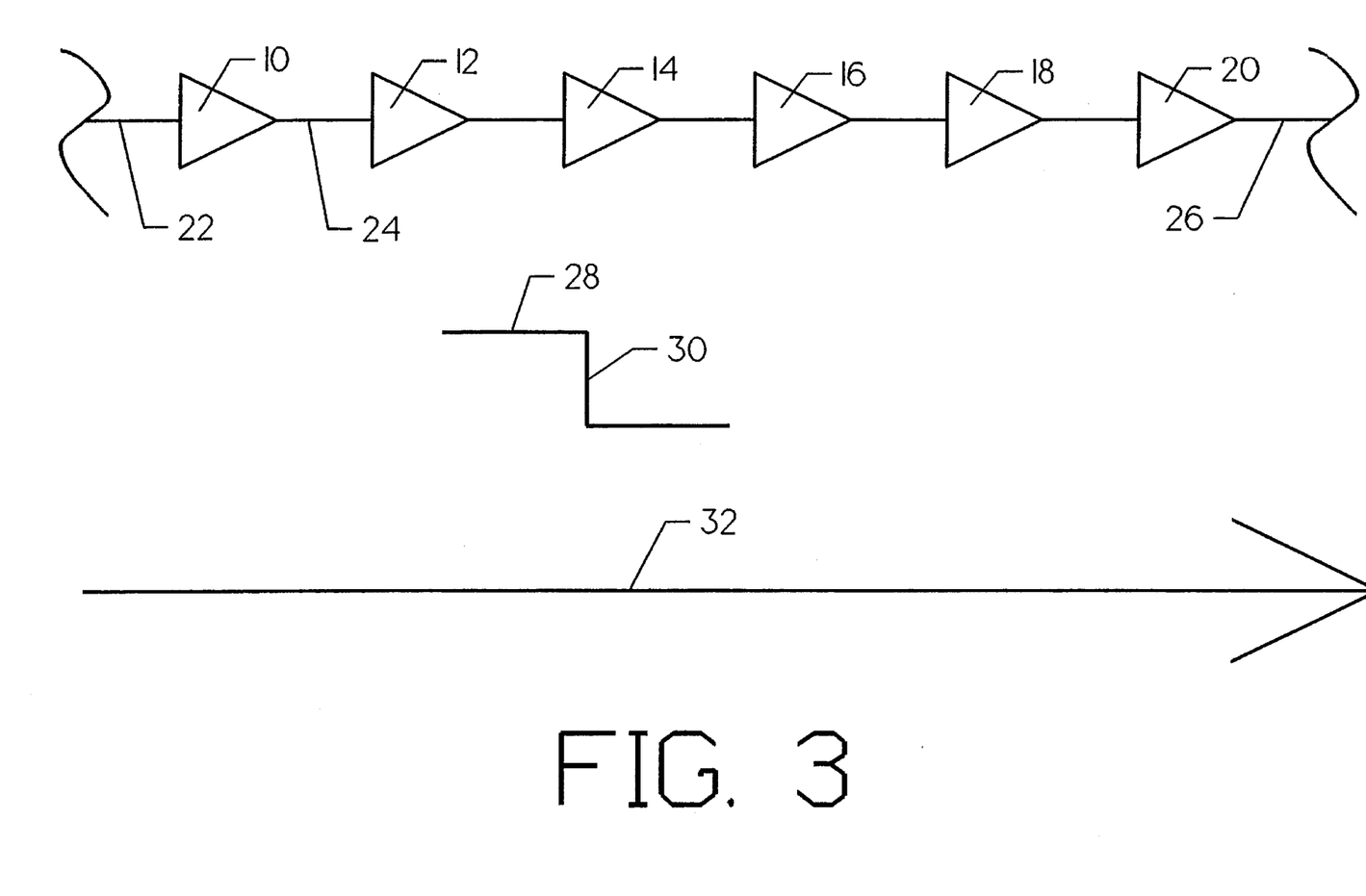
FIG. 3 is a schematic diagram showing the basic concept of the present invention.

FIG. 3 is an electrical schematic showing the basic concept of a delay line according to the present invention. Individual buffers or gates 40, 42, 44, 46, 48, and 50 are each subject to a propagation delay. According to the preferred mode, buffers 40, 42, 44, 46, 48, and 50 are all fabricated on the same monolithic substrate using standard integrated circuit fabrication techniques. This greatly lowers manufacturing cost, because the resulting structure and interconnects are so simple. Perhaps more important conceptually is that the propagation delay of each of the buffers is deemed to be nearly the same. As will be seen from the further discussion below, this is not necessary to operation of the present invention. However, it is convenient from a design perspective because it permits easy calculation of the quantization error. This means that the average individual propagation delay of the buffers is the limit of timing precision of the approach.

As leading edge 60 of signal pulse 58 is input to buffer 40 at point 52 and travels in the direction of arrow 62, it can be sensed at point 54 after the propagation delay of buffer 40. Similarly, if the propagation delays of each of the buffers is assumed to be the same as the propagation delay of buffer 40, leading edge 60 of signal pulse 58 can be expected at point 56 at about five times the propagation delay of buffer 40, because the signal must travel through five buffers (i.e. buffers 40, 42, 44, 46, 48, and 50). It can be readily seen that a delay of any multiple integral of the propagation delay of buffer 40 may be thus implemented.

Though any desirable delay within the quantization error of the approach (i.e. average propagation delay of one buffer) may be selected by choosing the appropriate number of cascaded buffers, the propagation delays of all of the buffers will vary with temperature, input voltage, manufacturing tolerances, etc. Therefore, absent an effective calibration technique, a delay line in accordance with FIG. 3 is useful only for applications wherein accuracy is not a particularly important concern. Furthermore to achieve the greatest accuracies, recalibration is required with changes in ambient conditions.

Figure 4:
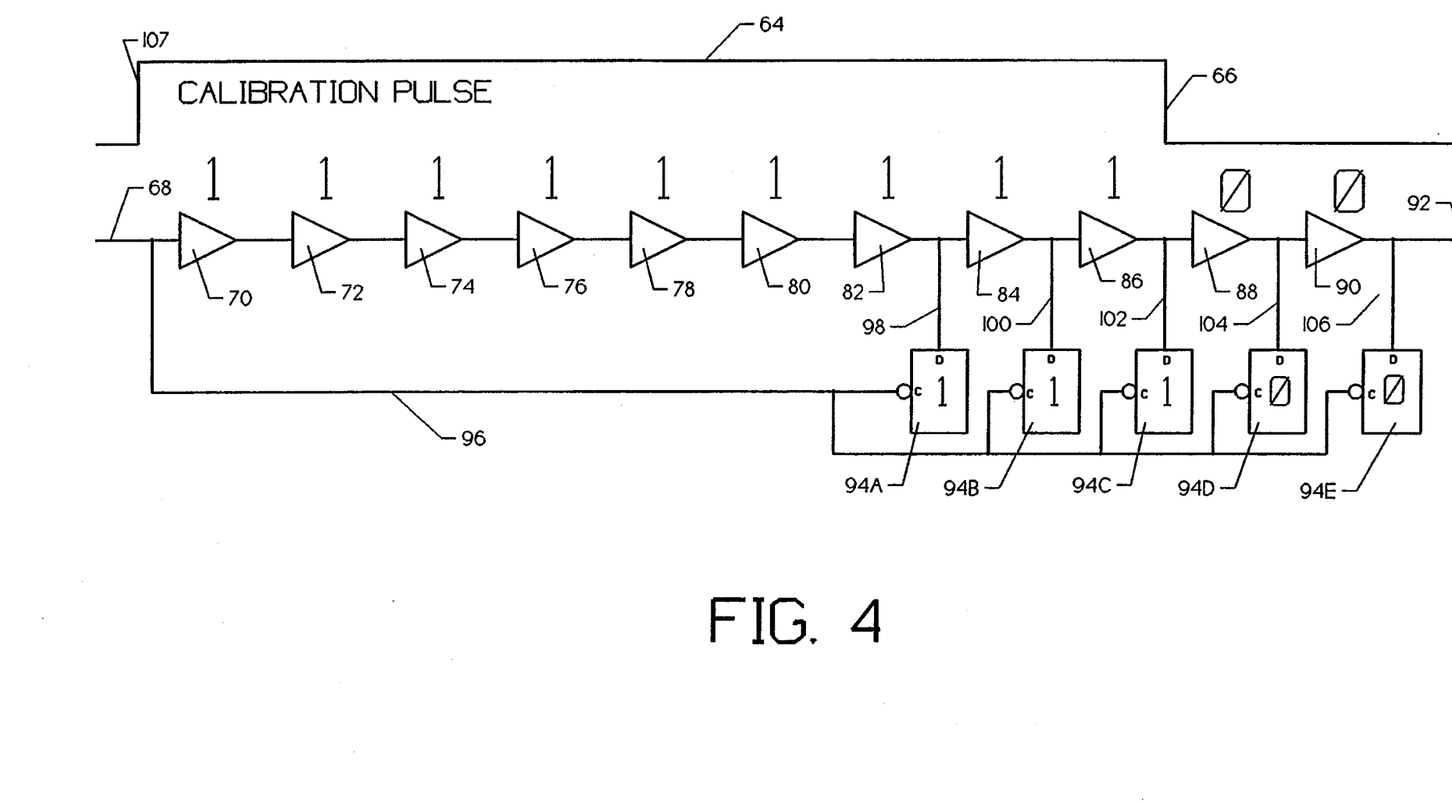
FIG. 4 is a schematic diagram showing the calibration method.

FIG. 4 is a schematic diagram of the present invention as applied to the calibration methodology. Calibration pulse 64, has a pulse width to which the delay line will be calibrated. It is input at point 68 beginning at leading edge 66. Calibration pulse 64 cascades through buffers 70, 72, 74, 76, 78, 80, 82, 84, 86, 88, and 90 toward output 92. As leading edge 66 passes buffer 82, line 98 sets the D flip-flop (i.e. D flip-flop 94A) input of the corresponding bit position in the calibration register, comprising individual D flip-flops 94A, 94B, 94C, 94D, and 94E. Similarly, as leading edge 66 passes buffers 84 and 86, the D flip-flop inputs of the corresponding bit positions (i.e. D flip-flops 94B and 94C) of the calibration register are set via lines 100 and 102. The trailing edge 107 of calibration pulse 64 reaches input point 68 as shown. At this time, line 96 clocks the inputs to the calibration register. Since leading edge 66 of calibration pulse 64 has not yet reached buffers 88 and 90, lines 104 and 106 are clear when the calibration register is clocked via line 96.

In this way, the time delay for a signal to cascade from input point 68 through buffer 86 is equal to the pulse width of calibration pulse 64. Calibration register 94 records this to the precision of the quantization error, which is the average propagation delay of one buffer. The quantization error can be decreased by using a larger number of buffers having smaller average propagation delays. This is a design consideration for a particular application as larger numbers of faster buffers tends to greatly increase the power dissipation requirements.

To this level of precision, the calibration process is as accurate as calibration pulse 64. This is important, because it permits calibration to whatever is assumed to be the standard. In the preferred mode, the present invention is utilized to receive high speed serial digital data transmissions. Therefore, if the calibration pulse is generated and transferred by the data transmitting device, the receiver is calibrated to it, even if not accurate. The advantages are even greater in bussed systems having multiple transmitting devices. By calibrating the receiver to each of the transmitting devices directly before data transmission, the technique compensates for variations in accuracy of the transmitting device as well as changes in ambient conditions.

A further design consideration is the width of calibration register 94. As shown in the drawing, not every buffer output (i.e. buffers 70, 72, 74, 76, 78, and 80) need have a corresponding bit position in calibration register 94. The width of calibration register 94 need only be sufficient to accommodate the change in propagation delays caused by changes in the ambient and inaccuracies of the calibration pulse. Of course, the width of the calibration register will need to increase if the quantization error is decreased by using a larger number of faster buffers.

Figure 5:
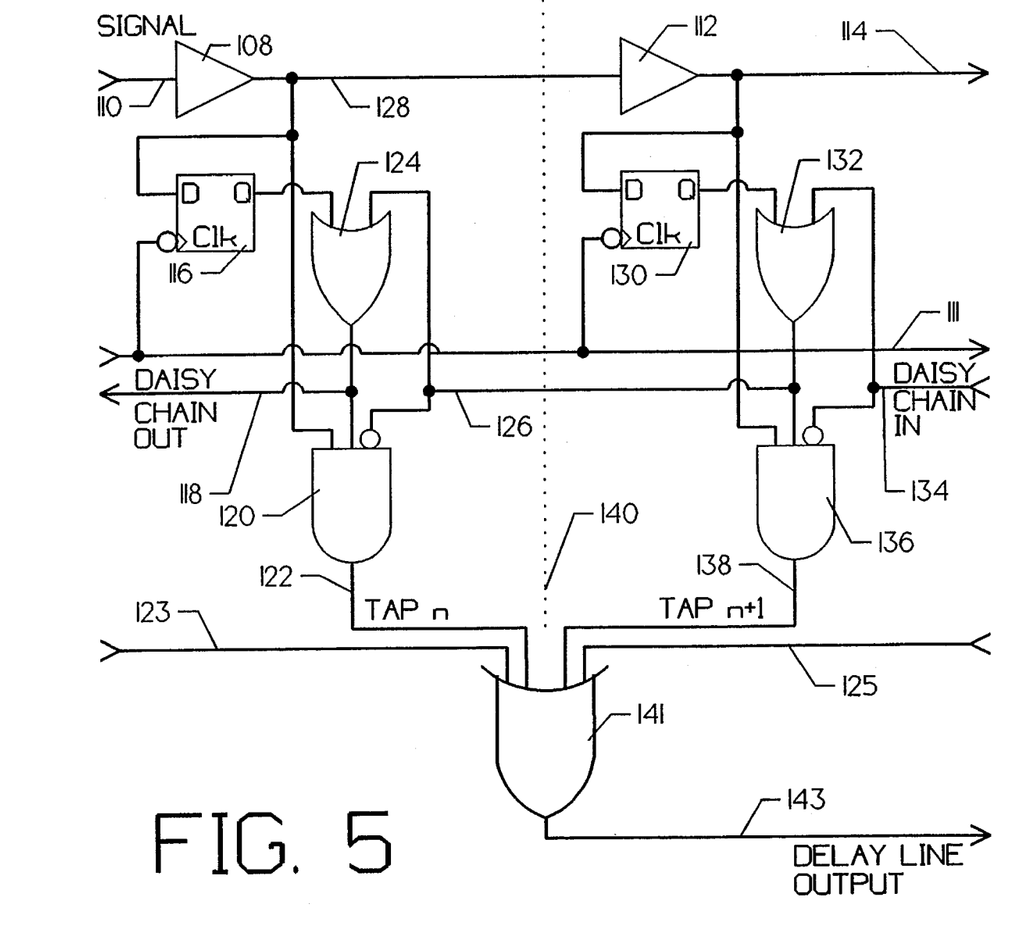
FIG. 5 is a schematic diagram of two stages of the delay line.

FIG. 5 is an electrical schematic diagram of two cells of the delay line of the present invention according to the preferred embodiment. For buffer position n (i.e. the circuitry to the left of divider 140), the signal is received at point 110, which is the input to buffer 108. As soon as the leading edge of the pulse is propagated to line 128 at the output of buffer 108, a first enable is presented to and-gate 120.

Flip-flop 116 corresponds to the nth bit of the calibration register. If the calibration process has determined that flip-flop 116 is set, then the Q output of flip-flop 116 is propagated through or-gate 124 and will enable the pulse on line 128 to propagate through and-gate 120 providing that line 126 is clear. This would result in tap n being selected by the calibration register as the delay line output.

Line 126 and or-gate 132 are one stage of a daisy chain that propagates through all taps of the delay line. Line 126 will be clear if calibration flip-flop 130 is clear and line 134 is clear. Line 134 is a daisy chain accumulation of the states of all down stream (i.e. >n+1) calibration register flip-flops. Therefore, tap n will be selected if calibration flip-flop n is the first calibration flip-flop set starting from the last bit of the calibration register moving up stream toward the first calibration register flip-flop.

The reason for the daisy chain is to ensure that only one tap is selected for the delay line output. Because of metastable conditions during the clocking of the calibration register, a value like 110100 may result. Without using or-gates like 124 and 132 in all cells of the delay line, two delay taps could be enabled concurrently. This daisy chain allows only the first set calibration flip-flop to enable its tap.

Figure 6:
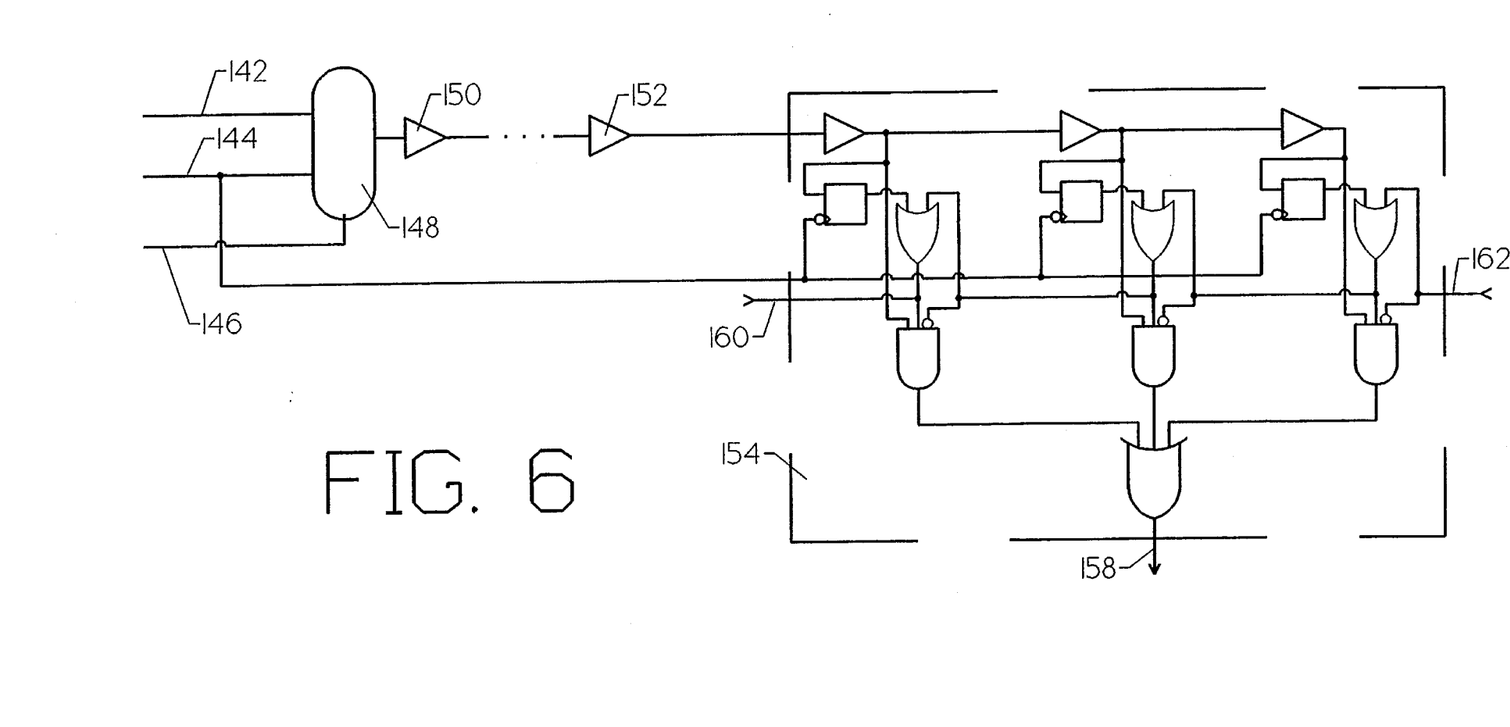
FIG. 6 is schematic diagram of a complete delay line.

FIG. 6 is a diagram showing the use of the calibration data to produce the desired signal delay. The data is presented on line 142. The calibration pulse input is received on line 144 whether generated externally or internally. Multiplexer 148 selects either the buffer data input or the calibration input under control of line 146.

The selected signal is cascaded through buffers 150, . . . 152, to calibration register 154. As a matter of convenience, only three buffered stages are shown as tapped. Again for clarity, each tapped stage is implemented as shown in FIG. 5 and discussed above.

Lines 160 and 162 are the daisy chain couplings as described above in detail. The output on line 158 corresponds to the delay line output as calibrated for the desired time value as explained in greater detail above.

Figure 7:
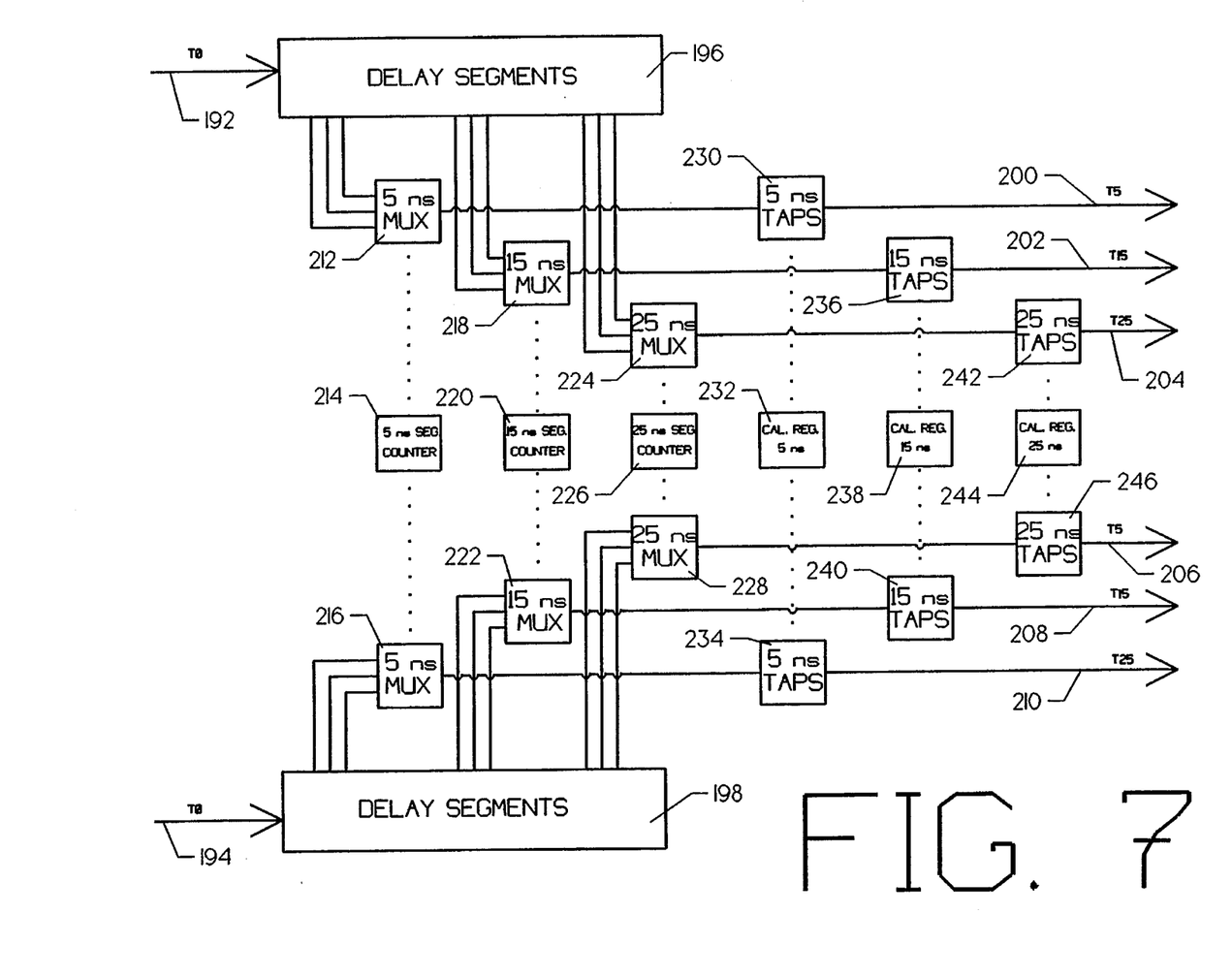
FIG. 7 is a block diagram showing the preferred mode of the present invention within a serial data receiver.

FIG. 7 is a block diagram of a receiver/decoder for High Speed Data Bus (HSDB) Winchester application. To meet the most stringent reliability requirements, all critical elements are duplicated. The input signal(s) is received via lines 192 and 194 at time T0 and applied to delay segments 196 and 198, respectively. Each of delay segments 196 and 198 is constructed and operated in the manner described above. For HSDB Winchester decoding, pulses of 5, 15, and 25 nanoseconds must be detected and distinguished.

Multiplexers 212 and 216 each select the appropriate buffer taps of delay segments 196 and 198, respectively, under control of 5 nanosecond segment counter 214, which has been calibrated in the manner discussed above. Similarly, 15 nanosecond multiplexers 218 and 222 and 25 nanosecond multiplexers 224 and 228 make selections under control of 15 nanosecond segment counter 214 and 25 nanosecond segment counter 226, respectively.

Calibration registers 232, 238, and 244 provide the necessary calibration data for 5, 15, and 25 nanoseconds, respectively. The 5 nanosecond taps 230 and 234 provide outputs 200 and 210, respectively, which have been delayed five nanoseconds to T5. Similarly, outputs 202 and 208 and outputs 204 and 210 provide the 15 and 25 nanosecond signal delays, respectively, from 15 nanosecond taps 236 and 240 and from 25 nanosecond taps 242 and 246.

Having thus described the preferred modes of the present invention, those of skill in the art will be readily able to apply the teachings found herein to yet other embodiments within the scope of the claims hereto attached.

I claim:

1. A delay line coupled to a transmitting device, comprising:
   a. a plurality of digital gates coupled in series wherein a signal applied to a first of said plurality of digital gates cascades through said plurality of digital gates at a rate determined by an average propagation delay of each of said plurality of digital gates, each of said plurality of digital gates having an output;
   b. a plurality of taps, each one of the plurality of taps being electrically coupled to a corresponding one of the outputs of said plurality of digital gates;
   c. a multiplexer for selecting a delay by selecting a one of said plurality of taps; and
   d. a register coupled to said multiplexer for storing a value to control said multiplexer to select said one of said plurality of taps, the value being defined by the transmitting device;
   f. a means responsively coupled to said register for setting said value defined by said transmitting device, wherein said setting means comprises a multiplexer for switching a pulse provided by said transmitting device into said first of said plurality of digital gates.

2. A delay line according to claim 1 wherein said setting means further comprises means coupled to said plurality of taps and said register for gating said taps to said register during said cascading of said pulse.

3. A method for delaying a signal comprising:
   a. providing a plurality of digital gates coupled in series wherein each of the plurality of digital gates has an output;
   b. providing a plurality of taps wherein each one of the plurality of taps is electrically coupled to a corresponding one of the outputs of said plurality of digital gates;

c. providing a multiplexer for selecting a delay by selecting a one of said plurality of taps;

d. providing a plurality of registers coupled to said multiplexer and further coupled to said plurality of taps for storing a plurality of values, the plurality of values controlling said multiplexer to select the one of said plurality of taps;

e. applying a pulse having a pulse width to a first of said plurality of digital gates such that said pulse cascades through said plurality of digital gates and onto the corresponding plurality of taps, the plurality of registers capturing the plurality of values on said plurality of taps at a predetermined period of time later thereby storing the plurality of values; and f. applying the signal to the first of said plurality of digital gates such that the signal cascades through said plurality of digital gates and onto the corresponding plurality of taps, where the plurality of values stored in step (e) controls said multiplexer to select the one of said plurality of taps that corresponds to said pulse width thereby delaying the signal for a time substantially equal to the pulse width.

4. A method according to claim 3 wherein step (f) is periodically repeated.

5. A method according to claim 4 wherein step (e) is periodically repeated.

6. A method according to claim 5 wherein the pulse applied in step (e) has a pulse width that may be varied each time step (e) is repeated.

* * * * *